(12) United States Patent
Sun et al.

(10) Patent No.: US 9,520,314 B2
(45) Date of Patent: Dec. 13, 2016

(54) HIGH TEMPERATURE ELECTROSTATIC CHUCK BONDING ADHESIVE

(75) Inventors: Jennifer Y. Sun, Mountain View, CA (US); Senh Thach, Union City, TX (US); Ren-Guan Duan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1913 days.

(21) Appl. No.: 12/640,496

(22) Filed: Dec. 17, 2009

(65) Prior Publication Data

US 2010/0156054 A1 Jun. 24, 2010

Related U.S. Application Data

(60) Provisional application No. 61/139,297, filed on Dec. 19, 2008.

(51) Int. Cl.
*H01L 21/68* (2006.01)
*H02N 13/00* (2006.01)
(Continued)

(52) U.S. Cl.
CPC ......... *H01L 21/6831* (2013.01); *C09D 183/04* (2013.01); *H01L 21/6833* (2013.01);
(Continued)

(58) Field of Classification Search
CPC . H01L 21/6831; H01L 21/6833; H02N 13/00; C09D 183/04; Y10T 279/23; Y10T 279/34
(Continued)

(56) References Cited

U.S. PATENT DOCUMENTS 3,518,221 A * 6/1970 Slocombe et al. ............ 523/209
3,536,657 A * 10/1970 Barth et al. ................... 524/540
(Continued)

FOREIGN PATENT DOCUMENTS

| EP | 1 101 810 A1 | 5/2001 | |
| JP | 2006-022168 | 1/2006 | |
| WO | WO 2008009803 A2 * | 1/2008 | ............... B81C 1/00 |

OTHER PUBLICATIONS

International Search Report and Written Opinion mailed Aug. 3, 2010 for PCT Application No. PCT/US20090/68686.

*Primary Examiner* — David Bryant
*Assistant Examiner* — Bayan Salone
(74) *Attorney, Agent, or Firm* — Moser Taboada; Alan Taboada

(57) ABSTRACT

Methods and apparatus for bonding an electrostatic chuck to a component of a substrate support are provided herein. In some embodiments, an adhesive for bonding components of a substrate support may include a matrix of silicon-based polymeric material having a filler dispersed therein. The silicon based polymeric material may be a polydimethylsiloxane (PDMS) structure having a molecular weight with a low molecular weight (LMW) content $\Sigma$ D3-D10 of less than about 500 ppm. In some embodiments, the filler may comprise between about 50 to about 70 percent by volume of the adhesive layer. In some embodiments, the filler may comprise particles of aluminum oxide ($Al_2O_3$), aluminum nitride (AlN), yttrium oxide ($Y_2O_3$), or combinations thereof. In some embodiments, the filler may comprise particles having a diameter of about 10 nanometers to about 10 microns.

23 Claims, 3 Drawing Sheets

(51) Int. Cl.
*C09D 183/04* (2006.01)
*H01L 21/683* (2006.01)

(52) U.S. Cl.
CPC ............ *H02N 13/00* (2013.01); *Y10T 279/23* (2015.01); *Y10T 279/34* (2015.01)

(58) Field of Classification Search
USPC .......... 279/128; 156/329, 325–327; 428/447
See application file for complete search history.

(56) References Cited

U.S. PATENT DOCUMENTS

| | | | | |
|---|---|---|---|---|
| 3,539,655 | A | * | 11/1970 | Strachan et al. ............... 525/534 |
| 3,576,387 | A | * | 4/1971 | Derby ............................. 174/36 |
| 4,370,358 | A | * | 1/1983 | Hayes et al. ................... 427/515 |
| 4,591,622 | A | * | 5/1986 | Blizzard et al. ............... 525/477 |
| 4,698,406 | A | * | 10/1987 | Lo et al. ......................... 528/12 |
| 4,950,563 | A | * | 8/1990 | Stewart et al. ................ 429/498 |
| 5,182,143 | A | * | 1/1993 | Holmes-Farley et al. .... 427/409 |
| 5,720,703 | A | * | 2/1998 | Chen et al. ...................... 492/56 |
| 5,813,870 | A | * | 9/1998 | Gaynes et al. .................. 439/91 |
| 5,830,565 | A | | 11/1998 | Budnaitis |
| 5,886,535 | A | * | 3/1999 | Budnaitis ................ 324/756.05 |
| 5,936,829 | A | * | 8/1999 | Moslehi ........................ 361/234 |
| 6,020,038 | A | * | 2/2000 | Chen et al. ................... 428/36.9 |
| 6,433,057 | B1 | | 8/2002 | Bhagwagar et al. ......... 524/403 |
| 6,534,581 | B1 | * | 3/2003 | Kleyer et al. ................. 524/379 |
| 6,540,592 | B1 | * | 4/2003 | Schultz et al. ................ 451/285 |
| 6,642,304 | B1 | * | 11/2003 | Hansen et al. ................ 524/590 |
| 6,657,772 | B2 | * | 12/2003 | Loxley ........................... 359/296 |
| 6,673,198 | B1 | | 1/2004 | Wicker |
| 6,723,202 | B2 | * | 4/2004 | Nagaiwa et al. ........ 156/345.43 |
| 6,839,217 | B1 | * | 1/2005 | Larsen ........................... 361/234 |
| 6,936,644 | B2 | * | 8/2005 | Gilleo ............................ 523/205 |
| 7,045,014 | B2 | * | 5/2006 | Mahon et al. ................. 118/500 |
| 7,235,288 | B2 | * | 6/2007 | Kajander et al. ........... 428/294.7 |
| 7,329,464 | B2 | * | 2/2008 | Aoki .............................. 428/447 |
| 7,476,446 | B2 | * | 1/2009 | Aoki .............................. 428/447 |
| 7,622,367 | B1 | | 11/2009 | Nuzzo et al. |
| 7,646,581 | B2 | * | 1/2010 | Sasaki et al. ................. 361/234 |
| 7,659,003 | B2 | * | 2/2010 | Aoki et al. .................... 428/447 |
| 7,672,110 | B2 | * | 3/2010 | Sun et al. ...................... 361/234 |
| 7,940,512 | B2 | * | 5/2011 | Handa et al. .................. 361/234 |
| 8,057,909 | B2 | * | 11/2011 | Aoki et al. .................... 428/447 |
| 8,101,241 | B2 | * | 1/2012 | Benayoun et al. ............ 427/387 |
| 2003/0127496 | A1 | | 7/2003 | Tetsuka et al. |
| 2004/0157064 | A1 | * | 8/2004 | Aoki .............................. 428/447 |
| 2004/0160021 | A1 | * | 8/2004 | Tatsumi et al. ............... 279/128 |
| 2005/0042881 | A1 | * | 2/2005 | Nishimoto et al. ........... 438/710 |
| 2005/0075438 | A1 | * | 4/2005 | Andersson et al. .......... 524/404 |
| 2005/0090602 | A1 | | 4/2005 | Koshikawa |
| 2005/0282977 | A1 | * | 12/2005 | Stempel et al. ............... 525/477 |
| 2006/0094834 | A1 | * | 5/2006 | Aoki et al. .................... 525/478 |
| 2006/0172140 | A1 | * | 8/2006 | Kuroda et al. ................ 428/447 |
| 2006/0175772 | A1 | * | 8/2006 | Nozawa ........................ 279/128 |
| 2006/0189777 | A1 | * | 8/2006 | Aoki ................................ 528/24 |
| 2007/0047170 | A1 | * | 3/2007 | Sun et al. ...................... 361/234 |
| 2007/0217114 | A1 | * | 9/2007 | Sasaki et al. ................. 361/145 |
| 2008/0003439 | A1 | * | 1/2008 | Aoki .............................. 428/447 |
| 2008/0029211 | A1 | | 2/2008 | Sun et al. |
| 2008/0066676 | A1 | | 3/2008 | Mariner et al. |
| 2008/0193741 | A1 | | 8/2008 | Fujii et al. |
| 2008/0266746 | A1 | * | 10/2008 | Handa et al. .................. 361/234 |
| 2009/0250130 | A1 | * | 10/2009 | Studer et al. .................. 137/833 |

\* cited by examiner

HIGH TEMPERATURE ELECTROSTATIC CHUCK BONDING ADHESIVE

CROSS-REFERENCE TO RELATED APPLICATIONS

This application claims benefit of U.S. provisional patent application Ser. No. 61/139,297, filed Dec. 19, 2008, which is herein incorporated by reference in its entirety.

FIELD

Embodiments of the present invention generally relate to substrate process equipment.

BACKGROUND

An electrostatic chuck (ESC) may be coupled to a component of a substrate support by, for example, an adhesive layer. As the feature size of devices to continue to shrink, the processes by which such devices are fabricated increasingly require higher temperature processes. The inventors have observed that conventional adhesive layers typically utilized to bond the ESC can become degraded by the higher temperature processes and may cause the ESC to delaminate from the component to which it is bonded. Such delamination may cause process uniformity issues as well as particle contamination from pieces of the adhesive layer.

Moreover, many processes being utilized or developed to fabricate smaller feature size devices also utilize increased RF power, which can further exacerbate the above-noted temperature problem and may also erode the adhesive layer.

Accordingly, the inventors have provided methods and apparatus for improving the bond between an ESC chuck and a component of a substrate support.

SUMMARY

Methods and apparatus for bonding an electrostatic chuck to a component of a substrate support are provided herein. In some embodiments, an adhesive for bonding components of a substrate support may include a matrix of silicon-based polymeric material having a filler dispersed therein. The silicon based polymeric material may be a polydimethylsiloxane (PDMS) structure having a molecular weight with a low molecular weight (LMW) content Σ D3-D10 of less than about 500 ppm. In some embodiments, the filler may comprise between about 50 to about 70 percent by volume of the adhesive layer. In some embodiments, the filler may comprise particles of aluminum oxide ($Al_2O_3$), aluminum nitride (AlN), yttrium oxide ($Y_2O_3$), or combinations thereof. In some embodiments, the filler may comprise particles having a diameter of about 10 nanometers to about 10 microns.

In some embodiments, a substrate support may include a base; an adhesive layer comprising a matrix of silicon-based polymeric material having a filler dispersed therein; and an electrostatic chuck disposed atop the base and the adhesive layer, wherein the adhesive layer bonds the base and the electrostatic chuck. In some embodiments, the silicon-based polymeric material may comprise a polydimethylsiloxane (PDMS) structure having a repeating dimethylsiloxane unit. In some embodiments, the matrix may be formed of a polymeric material having a molecular weight with a low molecular weight (LMW) content Σ D3-D10 of less than about 500 ppm. In some embodiments, the adhesive layer may be operable at a temperature of greater than about 120 degrees Celsius.

In some embodiments, a method of bonding a substrate support to an electrostatic chuck may include depositing an adhesive layer comprising a matrix of silicon based polymeric material having a filler dispersed therein atop a substrate support base; and bonding an electrostatic chuck to the substrate support base with the adhesive layer. The adhesive layer may be any of the adhesive formulations disclosed herein. Other and further embodiments are described below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
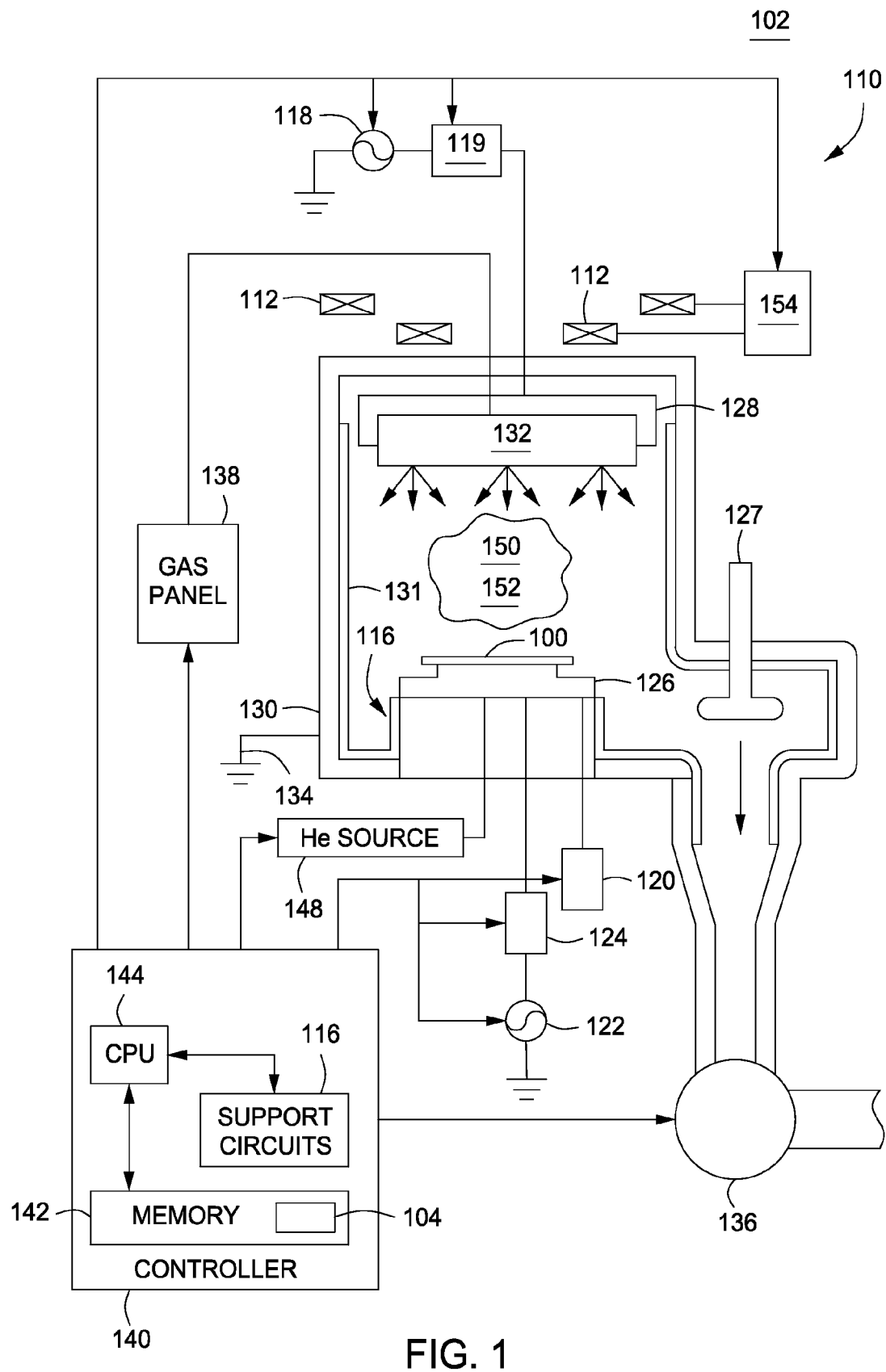
FIG. 1 depicts a schematic side view of an etch reactor having a process kit disposed therein in accordance with some embodiments of the present invention.

The drawings have been simplified for clarity and are not drawn to scale. To facilitate understanding, identical reference numerals have been used, wherever possible, to designate identical elements that are common to the figures. It is contemplated that some elements of one embodiment may be beneficially incorporated in other embodiments.

DETAILED DESCRIPTION

Methods and apparatus for bonding an electrostatic chuck to a component of a substrate support are provided herein. The inventive methods and apparatus provide an electrostatic chuck (ESC) coupled to a substrate support and means for fabricating the same that advantageously allow for the substrate support to operate in process environments having, for example, temperatures greater than about 120 degrees Celsius, or in some embodiments, up to about 180 degrees Celsius. The ESC may be coupled to a base of the substrate support utilizing an adhesive that may advantageously provide high thermal conductivity, high lap shear strain, high tensile strain, low outgassing, high purity, and/or high resistance to plasma erosion.

A substrate support in accordance with the present invention may be configured to be disposed in a process chamber. For example, FIG. 1 depicts a schematic diagram of an exemplary etch reactor 102 of the kind that may be used to practice embodiments of the invention as discussed herein. The reactor 102 may be utilized alone or, as a processing module of an integrated semiconductor substrate processing system, or cluster tool (not shown), such as a CENTURA® integrated semiconductor wafer processing system, available from Applied Materials, Inc. of Santa Clara, Calif. Examples of suitable etch reactors 102 include the DPS® line of semiconductor equipment (such as the DPS®, DPS® II, DPS® AE, DPS® G3 poly etcher, or the like), the ADVANTEDGE™ line of semiconductor equipment (such as the AdvantEdge, AdvantEdge G3), or other semiconductor equipment (such as ENABLER®, E-MAX®, or like equipment), also available from Applied Materials, Inc. The above listing of semiconductor equipment is illustrative only, and other etch reactors, and non-etch equipment (such as CVD reactors, or other semiconductor processing equipment) may be modified in accordance with the teachings provided herein.

The reactor 102 comprises a process chamber 110 having a conductive chamber wall 130 that is connected to an electrical ground 134 and at least one solenoid segment 112 positioned exterior to the chamber wall 130. The chamber wall 130 comprises a ceramic liner 131 that facilitates cleaning of the chamber 110. The byproducts and residue of the etch process are readily removed from the liner 131 after each wafer is processed. The solenoid segment(s) 112 are controlled by a DC power source 154 that is capable of producing at least 5 V. Process chamber 110 includes a substrate support 116 that is spaced apart from a showerhead 132. The substrate support 116 comprises an electrostatic chuck 126 for retaining a substrate 100 beneath the showerhead 132. The showerhead 132 may comprise a plurality of gas distribution zones such that various gases can be supplied to the chamber 110 using a specific gas distribution gradient. The showerhead 132 is mounted to an upper electrode 128 that opposes the substrate support 116. The electrode 128 is coupled to an RF source 118.

The electrostatic chuck 126 is controlled by a DC power supply 120 and the substrate support 116, through a matching network 124, which is coupled to a bias source 122. Optionally, the source 122 may be a DC or pulsed DC source. The upper electrode 128 is coupled to a radio-frequency (RF) source 118 through an impedance transformer 119 (e.g., a quarter wavelength matching stub). The bias source 122 is generally capable of producing a RF signal having a tunable frequency of 50 kHz to 13.56 MHz and a power of between 0 and 5000 Watts. The source 118 is generally capable of producing a RF signal having a tunable frequency of about 160 MHz and a power between about 0 and 2000 Watts. The interior of the chamber 110 is a high vacuum vessel that is coupled through a throttle valve 127 to a vacuum pump 136. Other forms of plasma etch chambers may be used to practice the invention, including reactive ion etch (RIE) chambers, electron cyclotron resonance (ECR) chambers, and the like.

The electrostatic chuck 126 is coupled to the substrate support 116 via an adhesive layer. The electrostatic chuck 126 may comprise a dielectric material such as a ceramic or the like, and having a conductive wire mesh (not shown) disposed therein. The wire mesh may be coupled to DC power supply 120 for providing a means to secure the substrate 100 to the surface of the electrostatic chuck 126.

The adhesive layer is described in detail below with respect to FIG. 2. The bond formed by the adhesive layer of the present invention is advantageously robust such that the substrate support can be operated in a process environment having temperatures of greater than about 120 degrees Celsius, and in some embodiments up to about 180 degrees, or more. Further, in some embodiments, the adhesive layer is capable of withstanding a process environment having a high plasma density, for example, a plasma density of up to about E10-E12 ions/cm$^3$.

Figure 2:
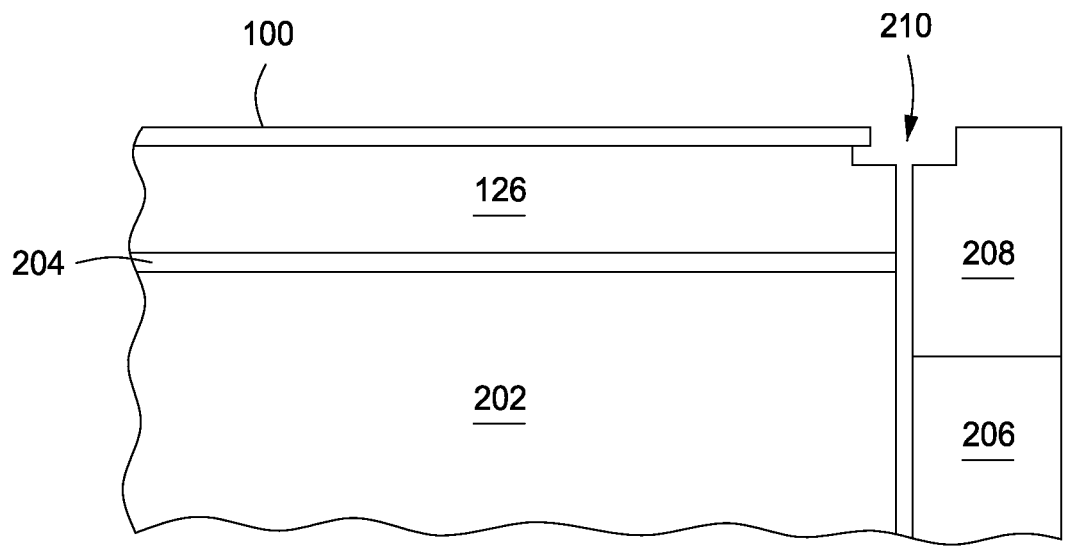
FIG. 2 depicts a partial side view of a substrate support in accordance with some embodiments of the present invention.

The substrate support 116 is depicted in further detail in FIG. 2, which depicts a partial side view of the substrate support 116. The substrate support 116 further includes a base 202, and an adhesive layer 204 disposed atop the base 202, where the adhesive layer 204 forms a bond between the base 202 and the electrostatic chuck 126.

The base 202 may provide one or more functions to the substrate support 116. For example, the base 202 may provide a support for holding the electrostatic chuck 126 thereabove. Alternatively, or in combination, the base 202 may act as a heat sink for removing heat from the substrate 100 disposed atop the electrostatic chuck 126. The base 202 may comprise any suitable material as necessary to provide the above discussed functions, or to be compatible with a plasma and/or semiconductor processing environment. In some embodiments, the base 202 is fabricated from aluminum (Al), stainless steel, Al-ceramic composites, or combinations thereof.

The adhesive layer 204 is disposed atop the base 202 and forms a bond between the base 202 and the electrostatic chuck 126. The adhesive layer 204 may have a thickness between about 4 to about 15 mils. Generally, the adhesive layer may have a thermal conductivity of greater than about 0.5 W/mK. The adhesive layer 204 may have lap shear strain, tensile strain, erosion resistance and outgassing properties at least equal to, or exceeding, that of currently employed adhesive materials, such as THERMATTACH® T412, available from Chomerics, a division of Parker Hannifin Corp., of Woburn, Mass. Further, the adhesive layer 204 may have high bulk purity (>99%) to limit metal contamination to the substrate 100 during processing. Further, the adhesive layer 204 may be resistant to reactive chemistries such as halogen-containing chemistries, or the like (for example, hydrogen bromide (HBr), chlorine ($Cl_2$), trifluoromethane ($CHF_3$), tetrafluoromethane ($CF_4$), or combinations thereof).

The adhesive layer 204 may comprise a matrix of a silicon-based polymeric material having a filler dispersed therein. In some embodiments, the matrix comprises polydimethylsiloxane (PDMS) or other suitable silicone materials. The matrix may be formed of linear polymers, branched polymers, cross-linked polymers or combinations thereof. Further, to achieve desired physical properties, such as shear and tensile strain or to limit outgassing of the adhesive layer, the matrix may be formed of polymeric materials having a molecular weight with a low molecular weight (LMW) content $\Sigma$ $D_3$-$D_{10}$ (e.g., the sum of all constituents of $D_3$ through $D_{10}$, wherein $D_3$ through $D_{10}$ refers to the repeating dimethylsiloxane unit) of, in some embodiments, less than about 200 ppm, or in some embodiments, less than about 500 ppm.

A filler may be dispersed with the matrix of the adhesive layer 204. The filler may be utilized, for example, to enhance mechanical or thermal properties, such as thermal conductivity. The filler may comprise between about 50 to about 70% by volume of the adhesive layer 204. In one embodiment, the filler is about 67% by volume of the adhesive layer 204. The filler may include particles, such as particles comprising aluminum oxide ($Al_2O_3$), aluminum nitride (AlN), yttrium oxide ($Y_2O_3$), or combinations thereof. The particles may range in diameter between about 10 nanometers to about 10 microns, or between about 100 nanometers to about 3 microns.

Optionally, the substrate support 116 may include additional components such as a cathode 206 for providing RF bias to the substrate 100, or a baffle assembly 208 disposed about the base 202. The baffle assembly 208 may be configured to hold a process kit, process kit shield, or the like. A gap 210 may exist between the peripheral edge of the electrostatic chuck 126, the adhesive layer 204, and the base 202, and the optional components of the substrate support 116. In some embodiments, a silicon insert may be disposed atop the gap 210 to limit reactive gases or plasma from entering the gap 210 during processing. Further, the substrate support 116 may include holes (not shown) disposed therethrough the base 202, adhesive layer 204 and electrostatic chuck 126 to accommodate, for example, lift pins (not shown) which can be utilized to raise and lower the substrate 100 with respect to the upper surface of the substrate support 116.

Returning to FIG. 1, in operation, the substrate 100 is placed on the substrate support 116. The chamber interior is pumped down to a near vacuum environment, and a gas 150 (e.g., argon), when ignited produces a plasma, is provided to the process chamber 110 from a gas panel 138 via the showerhead 132. The gas 150 is ignited into a plasma 152 in the process chamber 110 by applying the power from the RF source 118 to the upper electrode 128 (anode). A magnetic field is applied to the plasma 152 via the solenoid segment(s) 112, and the substrate support 116 is biased by applying the power from the bias source 122. During processing of the substrate 100, the pressure within the interior of the etch chamber 110 is controlled using the gas panel 138 and the throttle valve 127. The plasma 152 may be utilized, for example, to etch a feature such as a via or trench in the substrate 100.

The temperature of the chamber wall 130 is controlled using liquid-containing conduits (not shown) that are located in and around the wall. Further, the temperature of the substrate 100 is controlled by regulating the temperature of the substrate support 116 via a cooling plate (not shown) having channels formed therein for circulating a coolant. Additionally, a back side gas (e.g., helium (He) gas) is provided from a gas source 148 into channels, which are formed by the back side of the substrate 100 and the grooves (not shown) in the surface of the electrostatic chuck 126. The helium gas is used to facilitate a heat transfer between the substrate support 116 and the substrate 100. The electrostatic chuck 126 is heated by a resistive heater (not shown) within the chuck body to a steady state temperature and the helium gas facilitates uniform heating of the substrate 100. Using thermal control of the chuck 126, the substrate 100 is maintained at a temperature of between 10 and 500 degrees Celsius.

A controller 140 may be used to facilitate control of the chamber 110 as described above. The controller 140 may be one of any form of a general purpose computer processor used in an industrial setting for controlling various chambers and sub-processors. The controller 140 comprises a central processing unit (CPU) 144, a memory 142, and support circuits 146 for the CPU 144 and coupled to the various components of the etch process chamber 110 to facilitate control of the etch process. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. A software routine 104, when executed by the CPU 144, causes the reactor to perform processes, such as etch processes or the like, and is generally stored in the memory 142. The software routine 104 may also be stored and/or executed by a second CPU (not shown) that is remotely located from the hardware being controlled by the CPU 144.

Figure 3:
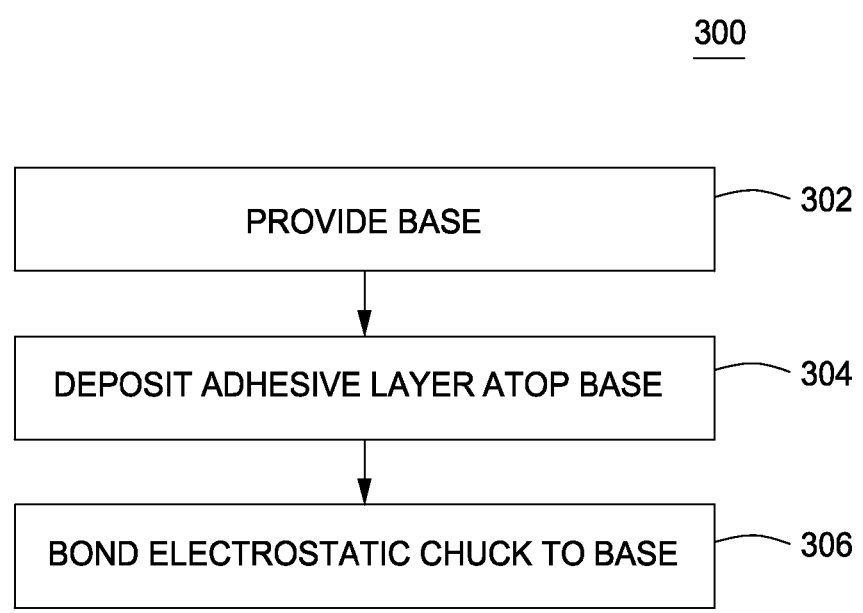
FIG. 3 depicts a flow chart of a method for fabrication a substrate support.
Figure 4A:
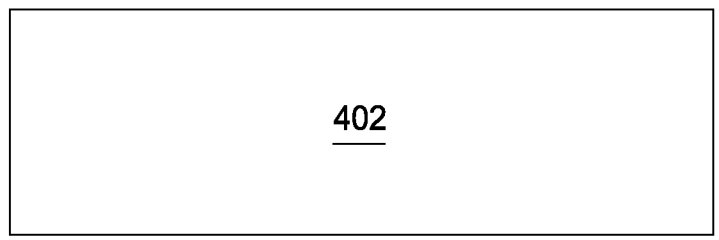
FIG. 4A-C depicts stages of fabrication of a substrate support in accordance with the method depicted in FIG. 3.

A flow chart of a method 300 for fabricating a substrate support is depicted in FIG. 3. The method 300 is described below with respect to the stages of fabrication of a substrate support depicted in FIG. 4A-C. The method 300 begins at 302 by providing a base 402 as depicted in FIG. 4A. The base 402 is similar in structure and function to the base 202 discussed above.

Figure 4B:
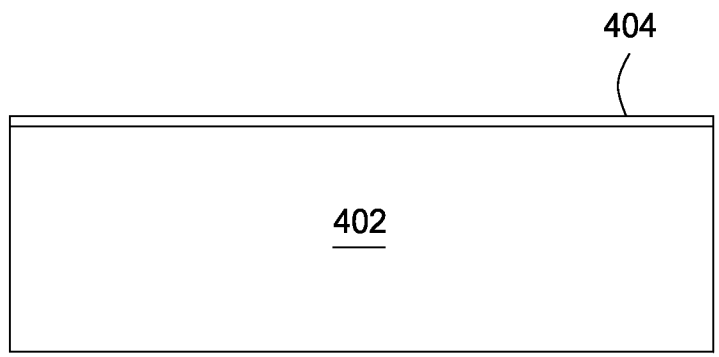

At 304, an adhesive layer 404 is deposited atop the base 402 as depicted in FIG. 4B. The adhesive layer 404 is similar in structure and function to the adhesive layer 404 discussed above. The adhesive layer 404 may be deposited as a pre-formed sheet or as a liquid. For example, when the liquid process is utilized, the matrix material, such as PDMS, and the filler, such as aluminum oxide ($Al_2O_3$) particles may be mixed together and degassed, for example by de-airing, to remove trapped gases or the like. A catalyst may then be added to the matrix and filler mixture. The catalyst may be, for example, a platinum catalyst or other suitable catalyst material to promote cross linking of the matrix material. The matrix material and catalyst have a mass ratio of between about 5:1 to about 20:1, where a lower mass ratio may result in increased cross-linking of the matrix material during the bonding process. The mixture may then again be degassed, for example by de-airing, and may be deposited atop the base 402 in liquid form. The pre-formed sheet may be formed by the same method as the liquid process, except that the sheet of adhesive may be first pre-cured to form a sheet and then deposited atop the base 402. In some embodiments, the mixture of the silicon-based polymeric material may be heated, or distilled, to remove at least some of the low molecular weight components from the mixture (e.g., the $D_3$ through $D_{10}$ units).

Figure 4C:
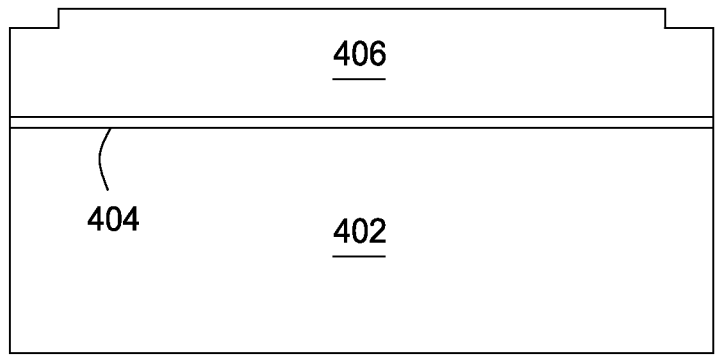

At 306, an electrostatic chuck 406 is bonded to the base 402 via the adhesive layer, as depicted in FIG. 4C. The bonding process may be performed in a pressure vessel, such as an autoclave oven or the like. In some embodiments, pressure in the pressure vessel is between about 50 to 200 psi. Alternatively, the bonding process may be performed by applying pressure between the electrostatic chuck 406 and the base 402, such as by gravity, clamping, screwing, or the like, to apply pressure while heating the base 402 and/or adhesive layer 404 to form a bond between the base 402 and electrostatic chuck 406. In some embodiments, about 0.5 to about 14.5 psi of pressure is applied by clamping or the like during the bonding process.

In some embodiments, the base 402 may be preheated prior to applying the adhesive layer 404. The preheat temperature of the base 402 may be between about 50 to 110 degrees Celsius. The preheat temperature, once reached, may be maintained throughout the bonding process. Optionally, the electrostatic chuck 406 may be preheated prior to applying pressure as well. The method 300 generally ends when the adhesive layer forms a bond between the electrostatic chuck 406 and the base 402. In some embodiments, pressure and heat are applied for between about 3 to about 8 hours to form the bond.

Optionally, post bond formation processing may include a bake at temperatures of between about 10 to about 30 degrees Celsius above the bonding temperature for a suitable duration to facilitate removal of lower molecular weight residues from the adhesive layer 404.

Optionally, in some embodiments, a primer may be utilized to promote adhesion of the adhesive layer 404 to, for example, a surface of the electrostatic chuck 406 and/or the base 402. The primer may include, for example, a metal organosilane, such as DC1200, available from Dow Corning Corp. of Midland, Mich. The primer may be applied to, and cured on, the bonding surface of the base 402 and/or the electrostatic chuck 406 prior to depositing and bonding the adhesive layer 404 using the methods discussed above.

Thus, methods and apparatus for bonding an electrostatic chuck to a substrate support are provided herein. The inventive methods and apparatus provide a substrate support and means for fabricating the same that advantageously allow for the substrate support to operate in a process environment of greater than about 120 degrees Celsius.

While the foregoing is directed to embodiments of the present invention, other and further embodiments of the invention may be devised without departing from the basic scope thereof.

The invention claimed is:

1. A substrate support, comprising:
   a base;
   an adhesive layer comprising a matrix of silicon-based polymeric material having a filler dispersed therein, wherein the matrix is formed of a silicon-based polymeric material having a molecular weight with a low molecular weight (LMW) content Σ D3-D10 of less than about 500 ppm; and
   an electrostatic chuck disposed atop the base and the adhesive layer, wherein the adhesive layer bonds the base and the electrostatic chuck.

2. The substrate support of claim 1, wherein the base comprises one of aluminum, stainless steel, ceramic, or aluminum-ceramic composite.

3. The substrate support of claim 1, further comprising:
   a baffle assembly disposed proximate the base, wherein the baffle assembly is configured to hold one of a process kit or a process shield.

4. The substrate support of claim 1, wherein the silicon-based polymeric material comprises a polydimethylsiloxane (PDMS) structure having a repeating dimethylsiloxane unit.

5. The substrate support of claim 1, wherein the adhesive layer is about 0.004 to about 0.015 inches thick.

6. The substrate support of claim 1, wherein the adhesive layer has a metal content of less than about 1 percent.

7. The substrate support of claim 1, wherein the adhesive layer is substantially non-reactive with halogen containing chemistries.

8. The substrate support of claim 1, wherein the adhesive layer is operable at a temperature of between about 120 degrees Celsius and about 180 degrees Celsius.

9. The substrate support of claim 1, wherein the adhesive layer has a thermal conductivity of at least about 0.5 W/mK.

10. The substrate support of claim 1, wherein the filler comprises between about 50 to about 70 percent by volume of the adhesive layer.

11. The substrate support of claim 10, wherein the filler comprises particles of aluminum oxide ($Al_2O_3$), aluminum nitride (AlN), yttrium oxide ($Y_2O_3$), or combinations thereof.

12. The substrate support of claim 10, wherein the filler comprises particles having a diameter of about 10 nanometers to about 10 microns.

13. A method of bonding a substrate support to an electrostatic chuck, comprising:
   depositing an adhesive layer comprising a matrix of silicon based polymeric material having a filler dispersed therein atop a substrate support base, wherein the silicon based polymeric matrix is formed of a polymeric material having a molecular weight with a low molecular weight (LMW) content Σ D3-D10 of less than about 500 ppm; and
   bonding an electrostatic chuck to the substrate support base with the adhesive layer.

14. The method of claim 13, wherein the silicon based polymeric material comprises a polydimethylsiloxane (PDMS) structure having a repeating dimethylsiloxane unit.

15. The method of claim 13, wherein the filler comprises between about 50 to about 70 percent by volume of the adhesive layer.

16. The method of claim 15, wherein the filler comprises particles of aluminum oxide ($Al_2O_3$), aluminum nitride (AlN), yttrium oxide ($Y_2O_3$), or combinations thereof.

17. The method of claim 15, wherein the filler comprises particles having a diameter of about 10 nanometers to about 10 microns.

18. The method of claim 13, wherein bonding the electrostatic chuck to the substrate support base comprises:
   applying a pressure of about 0.5 to about 14.5 psi between the electrostatic chuck and the base while heating at least one of the base or adhesive layer to a predetermined temperature.

19. The method of claim 13, wherein the bonding process is performed in a pressure vessel at a pressure of about 50 to about 200 psi.

20. The method of claim 13, further comprising:
   heating at least one of the base or the electrostatic chuck to a temperature of about 50 to about 110 degrees Celsius prior to depositing the adhesive layer.

21. The method of claim 13, further comprising:
   applying a metal organosilane primer to an adhesive-contacting surface of either or both of the electrostatic chuck and the base.

22. The method of claim 13, further comprising:
   heating the electrostatic chuck, adhesive layer and base, after bonding, to a temperature of between about 10 to 30 degrees Celsius above a bonding temperature to at least partially remove lower molecular weight residues from the adhesive layer.

23. A substrate support, comprising:
   a base;
   an adhesive layer comprising a matrix of silicon-based polymeric material having a filler dispersed therein, wherein the silicon-based polymeric material comprises a polydimethylsiloxane (PDMS) structure having a repeating dimethylsiloxane unit; and
   an electrostatic chuck disposed atop the base and the adhesive layer, wherein the adhesive layer bonds the base and the electrostatic chuck.

* * * * *